United States Patent [19]

Kato et al.

[11] Patent Number: 5,733,688
[45] Date of Patent: Mar. 31, 1998

[54] LITHOGRAPHIC MASK STRUCTURE AND METHOD OF PRODUCING THE SAME COMPRISING W AND MOLYBDENUM ALLOY ABSORBER

[75] Inventors: Hideo Kato, Utsunomiya; Masao Sugata, Yokohama; Keiko Chiba, Utsunomiya; Hiroshi Maehara, Yokohama, all of Japan

[73] Assignee: Canon Kabushiki Kaisha, Japan

[21] Appl. No.: 570,686

[22] Filed: Dec. 11, 1995

[30] Foreign Application Priority Data

Dec. 14, 1994 [JP] Japan ................................. 6-310546
Dec. 14, 1994 [JP] Japan ................................. 6-310547

[51] Int. Cl.$^6$ ........................................................ G03F 9/00
[52] U.S. Cl. ........................................................ 430/5; 378/35
[58] Field of Search ................................. 430/5, 322, 323; 427/585; 378/34, 35

[56] References Cited

U.S. PATENT DOCUMENTS

4,738,907  4/1988  Shigetomi et al. ........................ 430/5
5,188,706  2/1993  Hori et al. .............................. 156/643

Primary Examiner—S. Rosasco
Attorney, Agent, or Firm—Fitzpatrick, Cella, Harper & Scinto

[57] ABSTRACT

A mask suitably usable in X-ray lithography has a membrane and a radiation absorbing material pattern formed on the membrane, wherein the radiation absorbing material pattern contains an alloy including tungsten (W) and molybdenum (Mo), the proportion of the molybdenum content to the alloy being in a range of 0.1–50 wt %, the alloy having crystal precedence orientation of {110}. In one preferred form, the absorbing material pattern is provided on an amolphous metal layer formed on the mask membrane.

10 Claims, 7 Drawing Sheets

LITHOGRAPHIC MASK STRUCTURE AND METHOD OF PRODUCING THE SAME COMPRISING W AND MOLYBDENUM ALLOY ABSORBER

FIELD OF THE INVENTION AND RELATED ART

This invention relates to a mask structure suitably usable in lithography which uses radiation energy such as X-rays, for example, and also to a method of producing such a mask structure. In another aspect, the invention is concerned with a device manufacturing method which uses a lithographic mask structure such as described above.

Use of lithography techniques to locally change the surface of a workpiece has been adopted widely in industry, particularly, in the electronic industry. This method enables mass production of articles having the same pattern. Changing the surface of a workpiece can be performed by irradiation thereof with various types of energy beams. To form a pattern in that process, a mask having a beam blocking member locally formed on the mask surface is used. Where the radiation energy beam comprises visible light or ultraviolet light, generally a mask which is provided by forming a black or non-transparent pattern of silver or chromium upon the surface of a transparent substrate of glass or quartz, is used.

With recent increasing requirements for further reduction of the line width of a pattern to be formed and for further reductions in the time to complete the lithographic process, use of X-rays or a particle beam such as an electron beam or an ion beam as the radiation energy beam has attracted much attention.

Glass or quartz plates used as a mask substrate member for visible light or ultraviolet light, do not provide transmissivity to such energy beams, and they therefore cannot be a suitable mask substrate material. Thus, for a lithographic process using X-rays, for example, generally a mask is provided by an energy beam transmitting material and an energy beam absorbing material. The energy beam transmitting material comprises a single layer of, or a multi-layer of, an inorganic thin film such as, for example, silicone, silicon nitride or silicon carbide (ceramics thin film) or an organic thin film such as, for example, polyimide, polyamide or polyester. The energy beam absorbing material comprises metal such as, for example, gold, platinum or tungsten, formed in a pattern on the surface of the energy beam transmitting film.

Usually, such a mask does not have a self-holding property. Thus, it should be held by a holding member which usually comprises a ring-like holding base. Generally, therefore, an X-ray mask structure is provided by fixing, to one end face of a ring-like holding base by adhesion, an outside peripheral portion of a holding thin film having energy beam transmissivity, on one face of which a pattern of an energy beam absorbing mask material is formed.

In a lithographic process using an X-ray mask structure such as described above, a bulb type X-ray source wherein an electron beam impinges on a metal target such as palladium or rhodium to produce X-rays has been considered as an effective X-ray source. Recently, however, synchrotron orbital radiation lithography (SOR lithography) which uses radiation light produced from a synchrotron ring has attracted much attention.

SUMMARY OF THE INVENTION

Using SOR lithography raises a few unique problems. For example, the exposure wavelength changes to 4–10 angstroms, and the irradiation strength increases more than two digits which causes temperature rise. Positive measures should be taken to overcome these problems. An example is that, for the energy beam transmitting material, an inorganic film such as Si, SiN or SiC having good thermal conductivity and having a small thermal expansion coefficient should be used in place of an organic film such as polyimide. Also, the film thickness should be reduced to about 2 microns, from about 8 microns. As regards the transfer line width, because of the parallelism of synchrotron radiation light, it is expected that the transfer line width can be reduced to about 0.2 micron or less, from about 0.8 micron. The radiation beam absorbing material has to meet this requirement in the point of low thermal expansion, low stress and process stability, for example.

It is an object of the present invention to provide a lithographic mask structure having a good process stability and a good stability to change with time. This can be accomplished by selecting, as a pattern of absorbing material, a material having a good radiation beam absorbing property and a low thermal expansion coefficient and being superior in the point of dry etching treatment.

It is another object of the present invention to provide a lithographic mask structure with good adhesion to a mask membrane, wherein a pattern has uniform composition and good surface state.

It is a further object of the present invention to provide a method of producing a mask structure such as described above.

It is a still further object of the present invention to provide a device manufacturing method which uses a mask structure such as described above.

The inventors of the subject application have made investigations on absorbing pattern materials having a thermal expansion coefficient close, as much as possible, to that of Si or suitable X-ray transmitting material such as SiN, SiC, AlN or C (suitable X-ray transmitting material) and also having good surface state and low stress. Pursuant to these investigations, an alloy which contains tungsten (W) and molybdenum (Mo) has been found.

Thus, in one preferred form of a mask according to the present invention, a pattern formed on a mask membrane consists of an alloy containing tungsten (W) and molybdenum (Mo).

The inventors of the subject application have made further investigations on a radiation absorbing pattern material having good adhesion to a mask membrane and having uniform composition and good surface state. According to the investigations, a pattern having an amorphous metal layer has been found.

Thus, in another preferred form of a mask according to the present invention, a pattern formed on a mask membrane has an amorphous metal layer.

In another aspect, the present invention provides a device manufacturing method which comprises a lithographic transfer process for printing a pattern on a substrate by using a mask such as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[First Embodiment]

Figure 1:
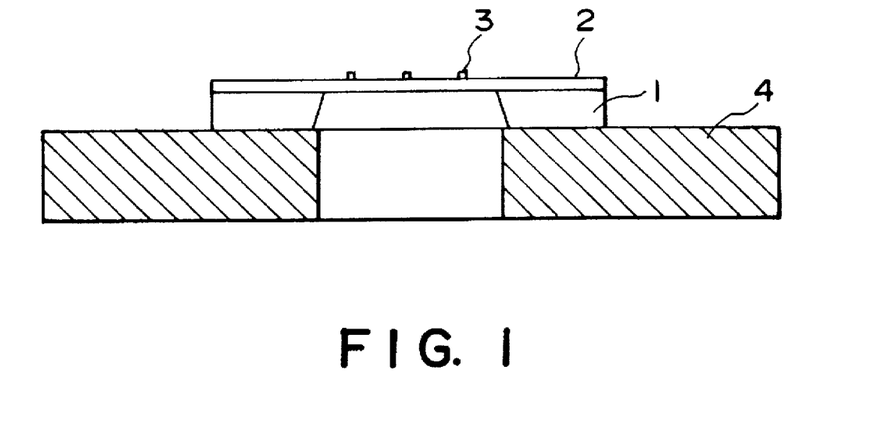
FIG. 1 is a sectional view of an X-ray mask structure according to an embodiment of the present invention.

A first embodiment of the present invention will now be explained. FIG. 1 is a sectional view of an X-ray mask structure, wherein denoted at 1 is a holding frame and denoted at 2 is an X-ray supporting film (membrane). Denoted at 3 is an X-ray absorbing material pattern, and denoted at 4 is a frame. While not shown in the drawing, a protection film for the X-ray absorbing material, an electrically conductive film and/or an anti-reflection film for alignment light may preferably be provided in this X-ray mask structure.

The holding frame i for holding the X-ray supporting film may be formed of a monocrystal Si. Fixed to this supporting frame 1 is the frame 4 which functions as a reinforcing member. As for the material of the frame 4, heat resisting glass or Si ceramics, for example, may be used.

The X-ray supporting film 2 should have a sufficient transmissivity to X-rays, and also it should have a sufficient strength to be free-standing. As for the material, an inorganic film such as Si, $SiO_2$, SiN, SiC, SiCN, BN or AlN, for example, radiation resisting organic film such as polyimide, for example, or a composite film of appropriate ones of them, may be used. The thickness may be within the range of 1–10 microns.

The X-ray absorbing material 3 should be sufficiently absorptive to X-rays, and also it should be one that can be easily processed. The material may consist of an alloy of W (tungsten) and Mo (molybdenum), and the thickness may be within the range of 0.1–1.0 micron.

Next, the process of forming the X-ray absorbing material 3 will be explained. A sputtering vapor deposition apparatus may be used as a film forming apparatus. An alloy of W (99–90 wt %) and Mo (1–10 wt %) may be used as a sputtering target. As regards the composition ratio of the alloy, at the largest the quantity of Mo may be increased to about 50 wt %. However, from the viewpoint of X-ray absorbing property, a condition for relatively high density may be selected. Ar (argon) gas may be used.

Figure 2:
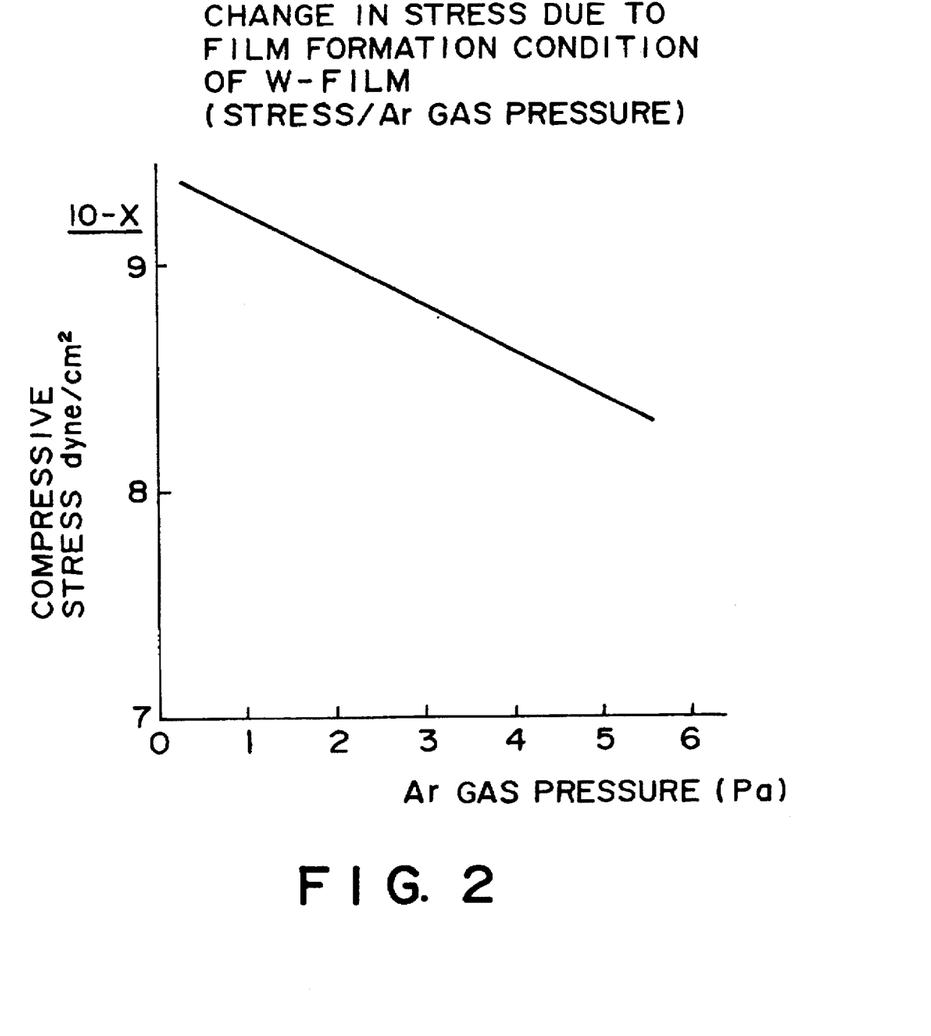
FIG. 2 is a graph for explaining changes in stress in accordance with the film forming condition for a W film.
Figure 3:
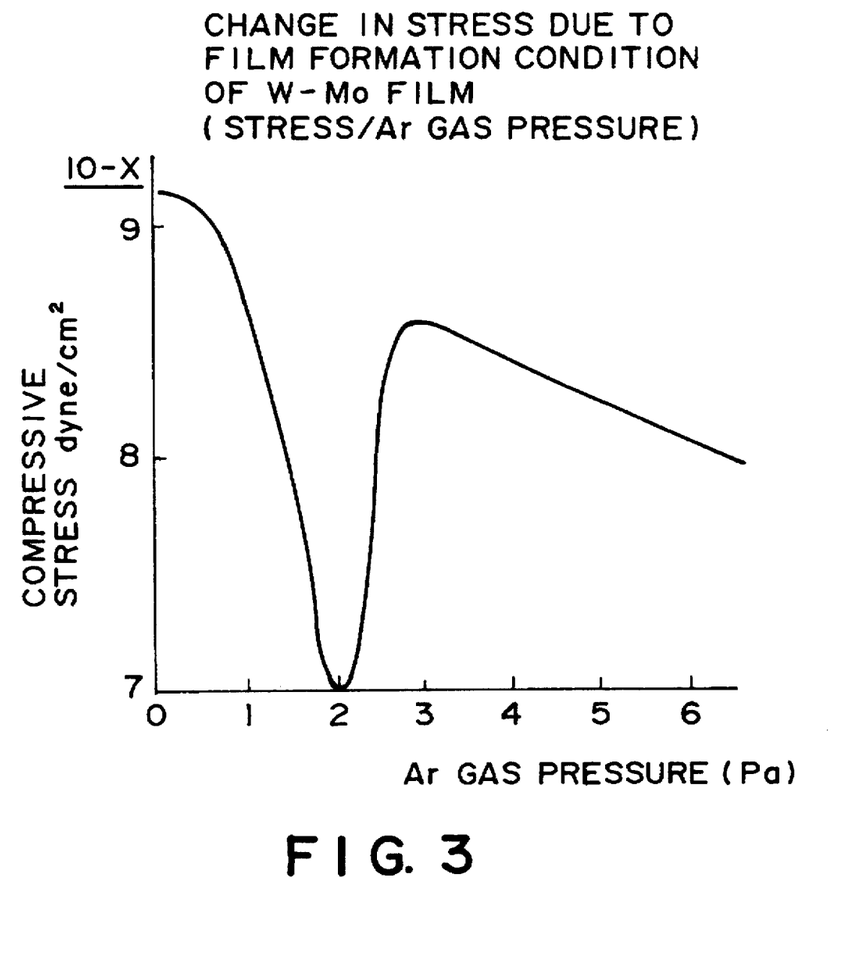
FIG. 3 is a graph for explaining changes in stress in accordance with the film forming condition for a W-Mo film.

FIG. 2 is a graph showing changes in film stress to a gas pressure in a case where a target of W only is used. It is seen that, to the gas pressure, the stress (compression) decreases rectilinearly. FIG. 3 is a graph showing changes in a case where a W-Mo target is used. It is seen in FIG. 3 that the gas pressure changes drastically about 2 Pa, and the stress (compression) decreases. This means that an X-ray absorbing material film of low stress can be formed under high-vacuum film forming conditions. It is known that, if a film is formed in a low vacuum, generally a large quantity of gas is incorporated into the film, causing a decrease of stress. This is undesirable because the density decreases and the change with time becomes larger. Also in this respect, it is seen that the phenomenon of W-Mo as observed above is very effective to the formation of an X-ray absorbing material film and to the production of a mask structure. It is possible that the gas pressure condition shifts a little, depending on the composition ratio of W and Mo or on the type of the sputtering apparatus used. However, it is certain that there is a transition point.

In FIG. 3, as regards the crystal state of a film as formed under a vacuum higher than the transition point, it has, according to the results of X-ray analysis, a precedence orientation of {211}, whereas films as formed at vacuums at the transition point and in a lower vacuum region have a precedence orientation of {110}. This shows that the crystal state of an alloy film of W and Mo can be changed in accordance with the film forming condition (sputtering gas pressure) and that, about the transition point, a film of low stress and high density with less incorporated gas is provided. In consideration of the above, the X-ray absorbing material 3 may preferably be provided by a film having a precedence orientation of {110} and, more preferably, a film as formed about the transition point.

The mask structure as proposed above provides advantageous effects one of which is that an X-ray absorbing film having uniform composition, good surface property and high density, can be formed with low stress through the sputtering vapor deposition process. Details are as follows:

(1) The two metals have similar properties and, therefore, a homogeneous sputtering target can be used.

(2) The two metals have similar sputtering rates and, therefore, a homogeneous deposition film is obtainable.

(3) A sputtered film of low stress can be formed in a high vacuum region (high density).

(4) It has a uniform etching characteristic to an etching gas of $SF_6$ or $CF_4$, for example.

Specific examples of this embodiment will be explained below.

<EXAMPLE 1-1>

In order to produce a mask structure for X-ray lithography, a SiN membrane film (X-ray supporting film) was formed with a thickness 2 microns through a CVD process upon a silicon substrate (X-ray holding frame) of 3 inch diameter and 2 mm thickness, whereby mask blanks were prepared. The SiN film at the bottom of the Si substrate was formed beforehand with a window for back etching, of a size 20×20 (mm) by use of a mask. The stress of membrane film was $4 \times 10^8$ $dyne/cm^2$ (tensile stress). On the other hand, as a film forming apparatus for X-ray absorbing material film, a sputtering apparatus was used. As a target, an alloy containing 90 wt % of W and 10 wt % of Mo was used. As a sputtering gas, Ar gas was used. The gas pressure was 1.5 Pa, and the RF power was 75 W. The film forming time was 80 minutes, with a result of 0.9 micron. The stress of the resultant film was $2 \times 10^7$ $dyne/cm^2$, and a small tensile stress was shown.

By using the structure thus obtained, an absorbing material pattern was then formed. First, by using an electron beam deposition apparatus, a Cr film of a thickness 0.05 micron was deposited on the W-Mo film. Additionally, a PMMA resist was deposited thereon to a thickness 0.5 micron through a spin coating process. After a predetermined pre-baking process, an electron beam pattern drawing apparatus was used to form a pattern of a line width 0.30 micron. Through a predetermined developing process, a resist pattern of 0.30 micron was formed. Subsequently, a dry etching apparatus was used with an etching gas of $CF_4$, and a Cr pattern of 0.3 micron was formed by using the resist pattern as a mask. The resist was then removed through an $O_2$ gas plasma process and, after that, an etching process was performed with a gas plasma of $SF_6$. As a result, an absorbing material pattern of W-Mo alloy of 0.30 micron was provided.

Subsequently, the bottom face of the Si substrate was back-etched. The etching process was carried out by applying a solution of 30 wt % of KOH with a temperature 110° C., to the window portion prepared beforehand in the SiN film. In that process, the absorbing material pattern on the upper face of the substrate was completely shielded so as to prevent the same from being influenced by the etching solution. It took about 6 hours for the etching of the Si substrate of 2 mm thickness. Finally, a ring-like reinforcing member (frame 4) of a diameter of 3 inches and a thickness of 8 mm was adhered to the film by using an epoxy adhesive agent, by which an excellent X-ray lithography mask structure was provided.

<EXAMPLE 1-2>

In order to produce a mask structure for X-ray lithography, a SiC membrane film (X-ray supporting film) was formed with a thickness 2 microns through a CVD process upon a silicon substrate of 3 inch diameter and 2 mm thickness, whereby mask blanks were prepared. The SiC film at the bottom of the Si substrate was formed beforehand with a window for back etching, of a size 20×20 (mm) by use of a mask. The stress of membrane film was $1 \times 10^9$ dyne/cm$^2$ (tensile stress). On the other hand, as a film forming apparatus for X-ray absorbing material film, a sputtering apparatus was used. As a target, an alloy containing 95 wt % of W and 5 wt % of Mo was used. As a sputtering gas, Ar gas was used. The gas pressure was 2 Pa, and the RF power was 100 W. The film forming time was 60 minutes, with a result of 0.8 micron. The stress of the resultant film was $-2 \times 10^7$ dyne/cm$^2$, and a small compressive stress was shown. The subsequent processes are similar to those of Example 1-1. An excellent X-ray lithography mask structure was provided.

<EXAMPLE 1-3>

In Example 1-1, as the etching gas for the W-Mo absorbing material pattern, a mixed gas of $CF_4$ and $O_2$ was used in place of $SF_6$. The result was that a mask with an excellent etching pattern was provided.

[Embodiment 2]

Figure 4:
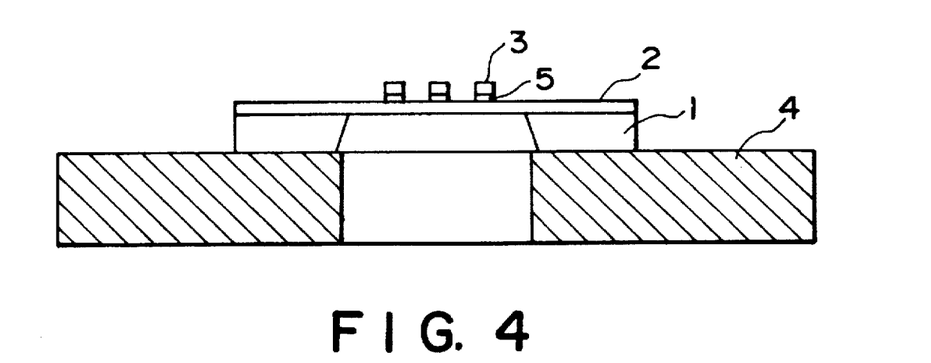
FIG. 4 is a sectional view of an X-ray mask structure according to another embodiment of the present invention.

A second embodiment of the present invention will now be explained. FIG. 4 is a sectional view of an X-ray mask structure, wherein denoted at 1 is a holding frame and denoted at 2 is an X-ray supporting film (membrane). Denoted at 3 is an X-ray absorbing material, and denoted at 5 is an amorphous metal layer which is provided between the X-ray supporting film 2 and the X-ray absorbing material 3. Denoted at 4 is a frame. While not shown in the drawing, a protection film for the X-ray absorbing material, an electrically conductive film and/or an anti-reflection film for alignment light may preferably be provided in this X-ray mask structure.

The holding frame 1 for holding the X-ray supporting film 2 may be formed of a monocrystal Si. Fixed to this supporting frame 1 is the frame 4 which functions as a reinforcing member. As for the material of the frame 4, heat resisting glass or Si ceramics, for example, may be used.

The X-ray supporting film 2 should have a sufficient transmissivity to X-rays, and also it should have a sufficient strength to be free-standing. As for the material, an inorganic film such as Si, $SiO_2$, SiN, SiC, SiCN, BN or AlN, for example, radiation resisting organic film such as polyimide, for example, or a composite film of appropriate ones of them, may be used. The thickness may be within the range of 1–10 microns.

The X-ray absorbing material 3 should be sufficiently absorptive to X-rays, and also it should be one that can be easily processed. The material may consist of an alloy of W (tungsten) and Mo (molybdenum), and the thickness may be within the range of 0.1–1.0 micron.

The amorphous metal layer may comprise an amorphous alloy of W-Mo-N, and the thickness thereof may be within the range of 0.05–0.5 micron.

Next, the process of forming an absorbing material pattern comprising the amorphous metal layer 5 and the the X-ray absorbing material 3 will be explained. A sputtering deposition apparatus may be used as a film forming apparatus. An alloy of W (99–90 wt %) and Mo (1–10 wt %) may be used as a sputtering target. As regards the composition ratio of the alloy, at the largest the quantity of Mo may be increased to about 50 wt %. However, from the viewpoint of X-ray absorbing property, a condition for relatively high density may be selected. Ar (argon) gas may be used.

Figure 5:
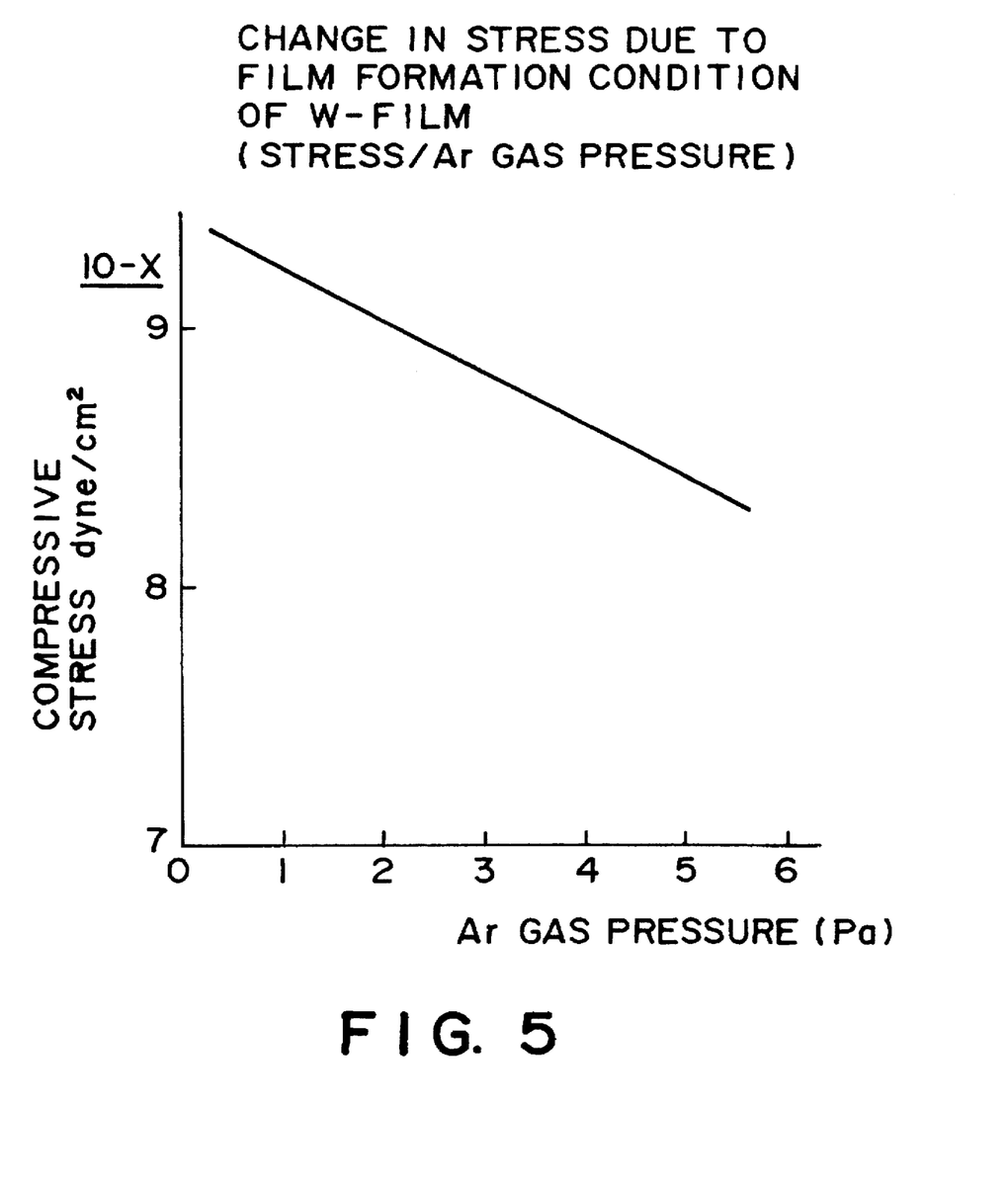
FIG. 5 is a graph for explaining changes in stress in accordance with the film forming condition for a W film.
Figure 6:
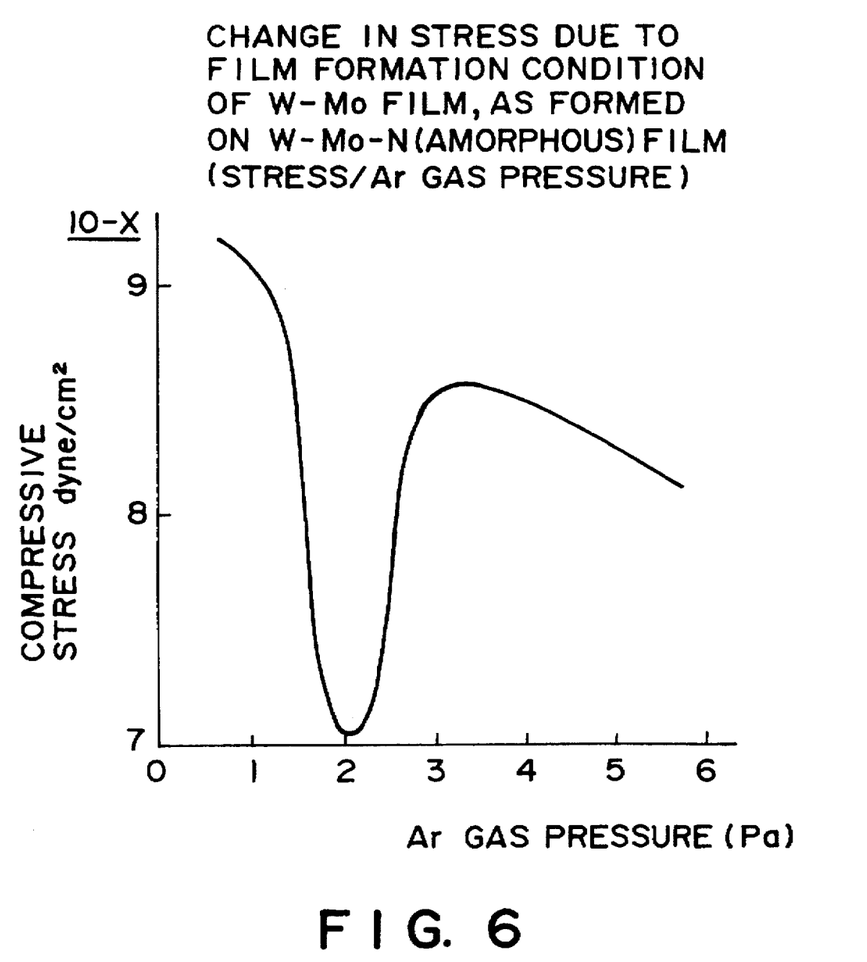
FIG. 6 is a graph for explaining changes in stress in accordance with the film forming condition for a W-Mo film.

FIG. 5 is a graph showing changes in film stress to a gas pressure in a case where a target of W only is used. It is seen that, to the gas pressure, the stress (compression) decreases rectilinearly. FIG. 6 is a graph showing changes in a case where a W-Mo target is used to form W-Mo-N and W-Mo successively. It is seen in FIG. 6 that the gas pressure changes drastically about 2 Pa, and the stress (compression) decreases. This means that an X-ray absorbing material film of low stress can be formed under high-vacuum film forming conditions. It is known that, if a film is formed in a low vacuum, generally a large quantity of gas is incorporated into the film, causing a decrease of stress. This is undesirable because the density decreases and the change with time becomes larger. Also in this respect, it is seen that the phenomenon of W-Mo as observed above is very effective to the formation of an X-ray absorbing material film and to the production of a mask structure. It is possible that the gas pressure condition shifts a little, depending on the composition ratio of W and Mo or on the type of the sputtering apparatus used. However, it is certain that there is a transition point.

In FIG. 6, the crystal state of a film formed under a vacuum higher than the transition point, has, according to the results of X-ray analysis, a precedence orientation of {211}, whereas films as formed at vacuums at the transition point and in a lower vacuum region have a precedence orientation of {110}. This shows that the crystal state of an alloy film of W and Mo can be changed in accordance with the film forming condition (sputtering gas pressure) and that, about the transition point, a film of low stress and high density with less incorporated gas is provided. In consideration of the above, the X-ray absorbing material 3 may preferably be provided by a film having a precedence orientation of {110} and, more preferably, a film as formed about the transition point.

The mask structure as proposed above provides advantageous effects one of which is that an X-ray absorbing film having uniform composition, good surface property and high density, can be formed with low stress through the sputtering vapor deposition process. Details are as follows:

(1) The two metals have similar properties and, therefore, a homogeneous sputtering target can be used.

(2) The two metals have similar sputtering rates and, therefore, a homogeneous deposition film is obtainable.

(3) A sputtered film of low stress can be formed in a high vacuum region (high density).

(4) It has a uniform etching characteristic to an etching gas of $SF_6$ or $CF_4$, for example.

Specific examples of this embodiment will be explained below.

<EXAMPLE 2-1>

In order to produce a mask structure for X-ray lithography, a SiN membrane film (X-ray supporting film) was formed with a thickness 2 microns through a CVD process upon a silicon substrate (X-ray holding frame) of 3 inch diameter and 2 mm thickness, whereby mask blanks were prepared. The SiN film at the bottom of the Si substrate was formed beforehand with a window for back etching, of a size 20×20 (mm) by use of a mask. The stress of membrane film was $4 \times 10^8$ dyne/cm$^2$ (tensile stress). On the other hand, as a film forming apparatus for X-ray absorbing material film, a sputtering apparatus was used. As a target, an alloy containing 90 wt % of W and 10 wt % of Mo was used. As a sputtering gas, Ar and $N_2$ gases were used. The selected gas ratio of Ar and $N_2$ was 1:1, for formation of the amorphous layer 5. The sputtering gas pressure was 4 Pa, and the RF power was 75 W. The film forming time was 10 minutes, with a result of 0.1 micron. Further sputtering process was carried out continuously with the Ar gas only, whereby the X-ray absorbing layer 3 was formed. The film forming time was 60 minutes, with a result of 0.8 micron. The stress of the resultant film was $-3 \times 10^7$ dyne/cm$^2$, and a small tensile stress was shown.

By using the structure thus obtained, an absorbing material pattern was then formed. First, by using an electron beam deposition apparatus, a Cr film of a thickness 0.05 micron was deposited on the W-Mo film. Additionally, a PMMA resist was deposited thereon to a thickness 0.5 micron through a spin coating process. After a predetermined pre-baking process, an electron beam pattern drawing apparatus was used to form a pattern of a line width 0.30 micron. Through a predetermined developing process, a resist pattern of 0.30 micron was formed. Subsequently, a dry etching apparatus was used with an etching gas of $CF_4$, and a Cr pattern of 0.3 micron was formed by using the resist pattern as a mask. The resist was then removed through an $O_2$ gas plasma process and, after that, an etching process was performed with a gas plasma of $SF_6$. As a result, an absorbing material pattern of W-Mo alloy of 0.30 micron was provided.

Subsequently, the bottom face of the Si substrate was back-etched. The etching process was carried out by applying a solution of 30 wt % of KOH with a temperature 110° C., to the window portion prepared beforehand in the SiN film. In that process, the absorbing material pattern on the upper face of the substrate was completely shielded so as to prevent the same from being influenced by the etching solution. It took about 6 hours for the etching of the Si substrate of 2 mm thickness. Finally, a ring-like reinforcing member (frame 4) of a diameter of 3 inches and a thickness of 8 mm was adhered to the film by using an epoxy adhesive agent, by which an excellent X-ray lithography mask structure was provided.

<EXAMPLE 2-2>

Figure 7:
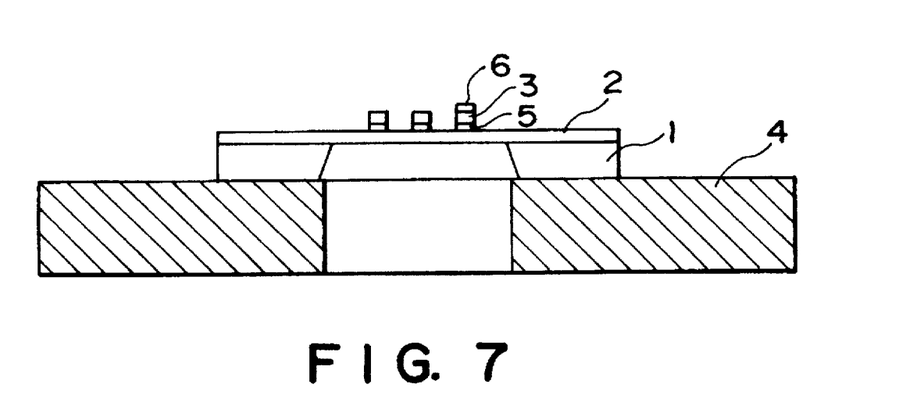
FIG. 7 is a sectional view of an X-ray mask structure according to a further embodiment of the present invention.

FIG. 7 is a sectional view of an X-ray mask structure according to another embodiment of the present invention. In order to produce a mask structure for X-ray lithography, a SiC membrane film (X-ray supporting film) was formed with a thickness 2 microns through a CVD process upon a silicon substrate of 3 inch diameter and 2 mm thickness, whereby mask blanks were prepared. The SiC film at the bottom of the Si substrate was formed beforehand with a window for back etching, of a size 20×20 (mm) by use of a mask. The stress of membrane film was $1 \times 10^9$ dyne/cm$^2$ (tensile stress). On the other hand, as a film forming apparatus for X-ray absorbing material film including an amorphous metal layer, a sputtering apparatus was used. As a target, an alloy containing 95 wt % of W and 5 wt % of Mo was used. As a sputtering gas, for formation of the amorphous layer 5, Ar gas and $N_2$ gas in a ratio of 2:1 were used. The gas pressure was 2 Pa, and the RF power was 100 W. The film forming time was 8 minutes, with a result of 0.1 micron. The sputtering process was continued with the Ar gas only, for 60 minutes, whereby the X-ray absorbing material layer 3 was formed on the amorphous metal layer 5. Further, the sputtering process was continued whereby, at the top layer, an amorphous layer 6 of about 0.1 micron thickness was formed in a similar way. The stress of the resultant film was $-2 \times 10^7$ dyne/cm$^2$, and a small compressive stress was shown. The subsequent processes are similar to those of Example 2-1. An excellent X-ray lithography mask structure was provided.

<EXAMPLE 2-3>

In Example 2-1, as the etching gas for the absorbing layer pattern comprising a W-Mo-N amorphous layer and a W-Mo alloy layer, a mixed gas of $CF_4$ and $O_2$ was used in place of $SF_6$. The result was that a mask with an excellent etching pattern was provided.

<EXAMPLE 2-4>

In Example 2-1, an alloy of W-Mo (95:5 wt %) was used in place of W-Mo (90:10 wt %) alloy. Under the same conditions, an amorphous alloy of W-Mo-N was formed with a thickness 0.1 micron as an underlying layer, and continuously an alloy of W-Mo was deposited thereon to a thickness 0.8 micron. Through subsequent similar processes, an excellent mask having a pattern of 0.3 micron line width was provided.

<EXAMPLE 2-5>

In Example 2-4, a film of 0.9 micron was formed only with an amorphous alloy, that is, W-Mo-N film. Under the film forming condition of sputtering gas pressure of 4 Pa, a compressive stress of $-8 \times 10^7$ dyne/cm$^2$ was showed. In this example, as compared with conventional W-N films, a low stress and good surface property were obtained under the same film forming conditions. Further, the amount of nitrogen could be limited, and a relatively high density absorbing material pattern was provided.

[Embodiment of Exposure Apparatus]

Now, an embodiment of an X-ray exposure apparatus which uses an X-ray mask produced in the manner according to any one of the above-described examples, will be explained.

Figure 8:
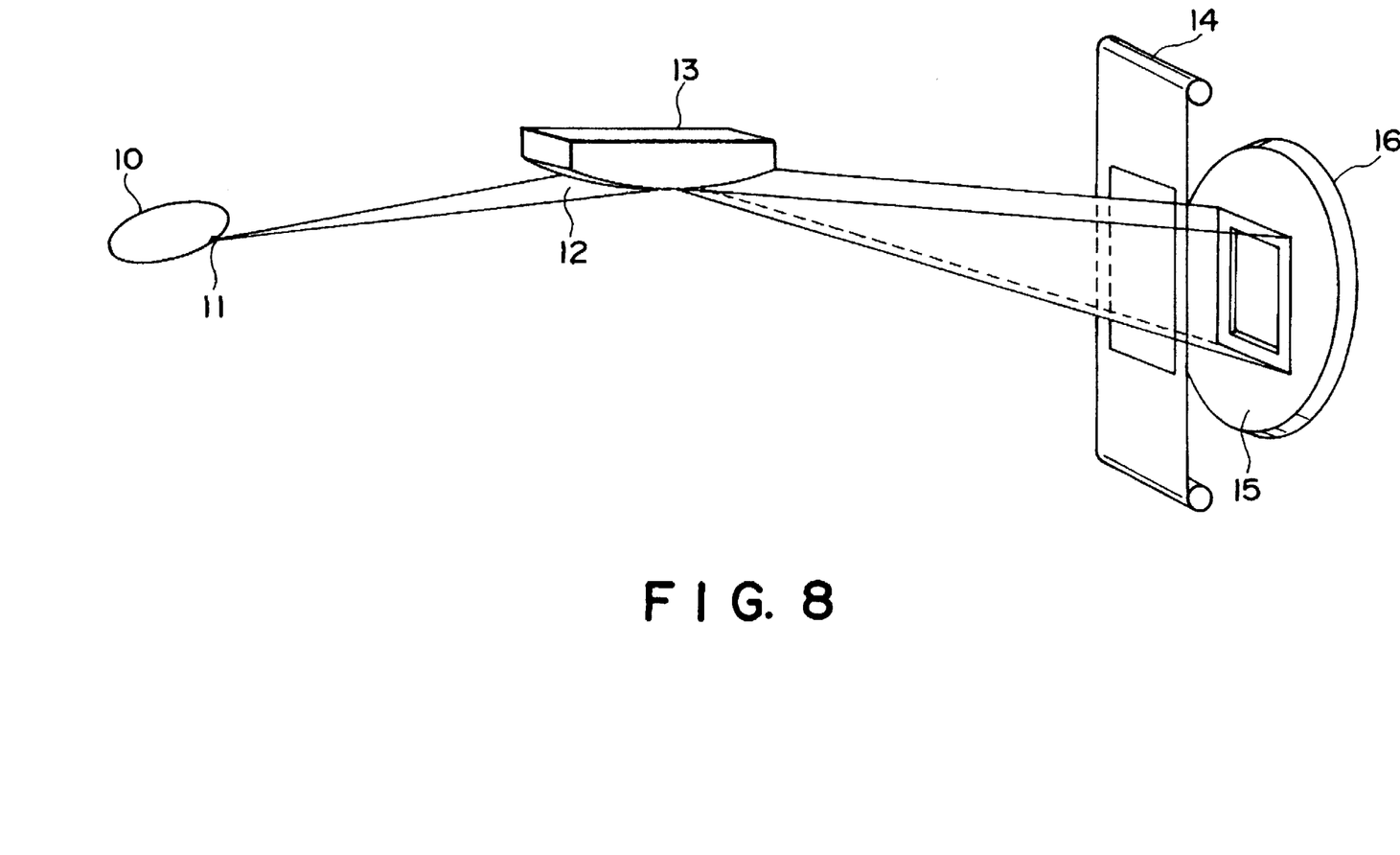
FIG. 8 is a schematic view for explaining a general structure of an X-ray exposure apparatus.

FIG. 8 is a schematic view of a general structure of an X-ray exposure apparatus. In the drawing, synchrotron radiation light 12 of sheet-beam shape as projected from a light emission point 11 of a synchrotron radiation source 10 is expanded by a convex mirror 13, having a small curvature, in a direction perpendicular to the radiation orbital plane. The expanded radiation beam is then regulated by a movable shutter 14 so as to provide uniform exposure amount within the irradiation region. The radiation beam passing through the shutter 14 is projected to an X-ray mask 15. The X-ray mask 15 is the one having been produced in accordance with any one of the embodiments or examples described hereinbefore.

Wafer 16 has a resist coating of a thickness 1 micron, having been applied through a spin coating process, and it has been treated by a pre-baking treatment under predetermined conditions. The wafer 16 is placed with a close distance of about 30 microns to the X-ray mask 15. Through a stepping (step-and-repeat) exposure process, mask patterns are printed sequentially on shot zones of the wafer 16. After this, the wafer is collected and is then processed by a developing treatment. A negative type resist pattern of line width 30 microns and height 1 micron was obtained in this embodiment.

[Embodiment of Device Manufacture]

Next, an embodiment of microdevice manufacturing method which uses an X-ray exposure apparatus such as described above, will be explained. Here, the term "microdevice" refers to a semiconductor device such as semiconductor chip (e.g., IC or LSI), a liquid crystal device, a micromachine or a thin film magnetic head, for example. The following example is the manufacture of semiconductor devices.

Figure 9:
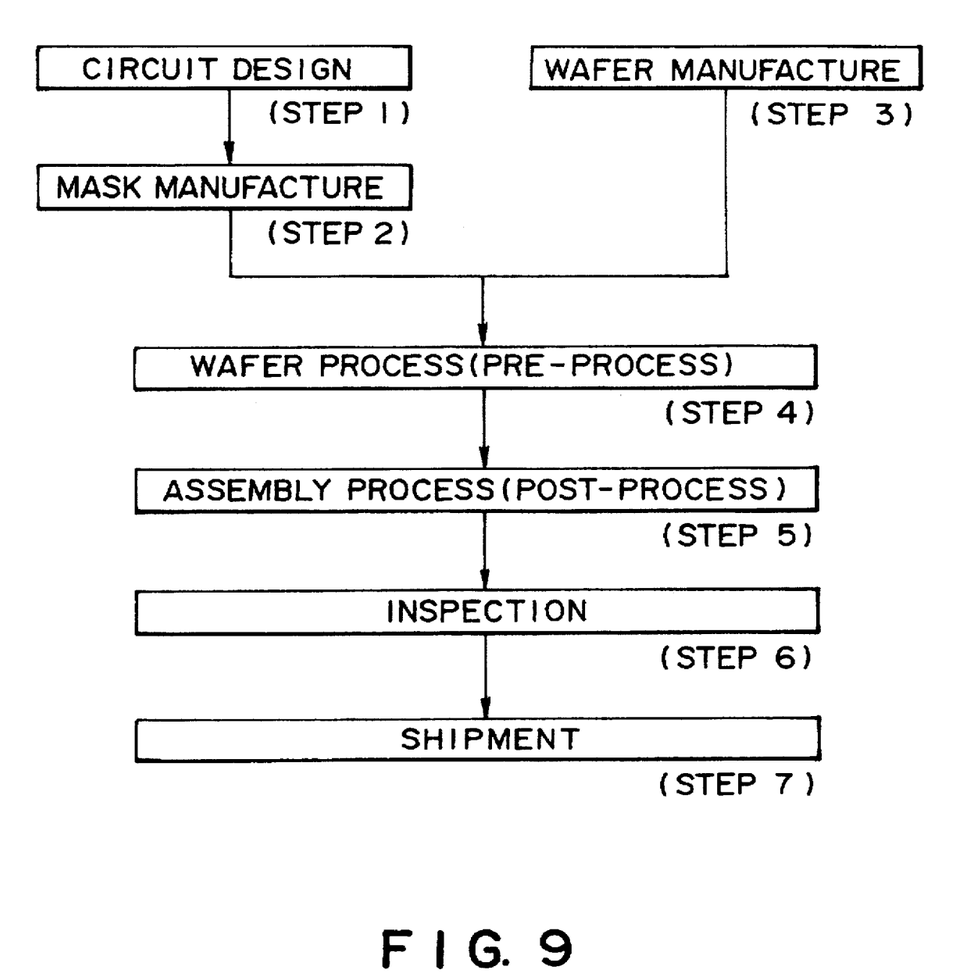
FIG. 9 is a flow chart for explaining semiconductor device manufacturing processes as a whole.

FIG. 9 is a flow chart of the overall sequence of manufacturing semiconductor devices. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 10:
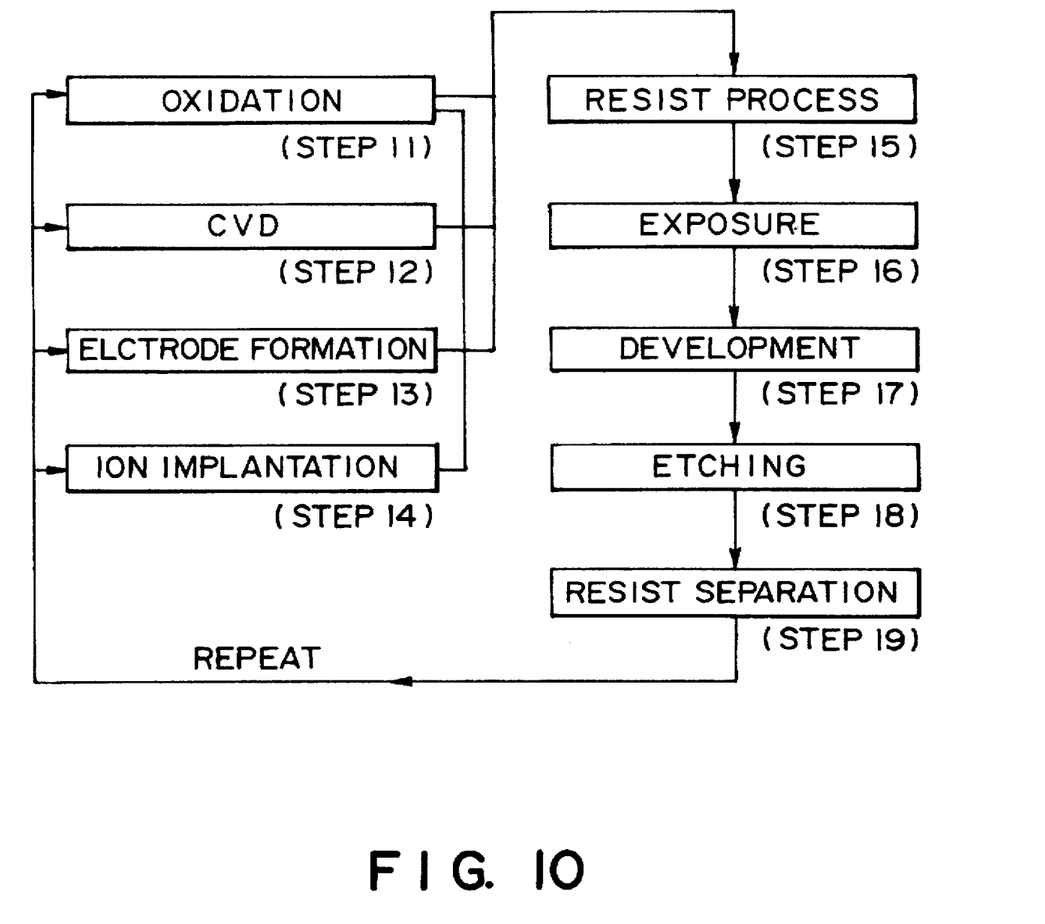
FIG. 10 is a flow chart for explaining a wafer process in detail.

FIG. 10 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A mask for X-ray lithography, comprising:

a membrane for transmitting X-rays; and a mask pattern formed on the membrane, wherein said mask pattern comprises a material having absorptivity to X-rays and containing an alloy including tungsten and molybdenum.

2. A mask according to claim 1, wherein the proportion of molybdenum content in the alloy is in a range of 0.1 to 50 wt %.

3. A mask according to claim 1, wherein the alloy has crystal precedence orientation of {110}.

4. A device manufacturing method which includes a lithographic process for printing a pattern on a substrate by use of a mask according to claim 1.

5. A mask according to claim 1, wherein the alloy is provided through a dry etching process based on a gas plasma mainly consisting of either a carbon fluoride gas or a sulfur fluoride gas.

6. A mask according to claim 1, wherein the alloy is provided through a sputtering deposition process based on an inert gas.

7. A mask according to claim 1, wherein the alloy is provided on the membrane through an amorphous metal layer.

8. A mask according to claim 1, wherein the membrane consists of SiN.

9. A mask according to claim 7, wherein the amorphous metal layer contains nitrogen.

10. A mask according to claim 1, wherein the membrane has a thickness of about 1 to about 10 microns and the mask pattern material has a thickness of about 0.1 to about 1.0 micron.

\* \* \* \* \*